United States Patent
Iwatani et al.

(10) Patent No.: US 12,044,962 B2
(45) Date of Patent: Jul. 23, 2024

(54) FORMING APPARATUS, FORMING METHOD, AND ARTICLE MANUFACTURING METHOD

(71) Applicant: CANON KABUSHIKI KAISHA, Tokyo (JP)

(72) Inventors: Satoshi Iwatani, Utsunomiya (JP); Byung-Jin Choi, Austin, TX (US); Makoto Mizuno, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 425 days.

(21) Appl. No.: 16/389,085

(22) Filed: Apr. 19, 2019

(65) Prior Publication Data
US 2020/0333702 A1    Oct. 22, 2020

(51) Int. Cl.
| | | |
|---|---|---|
| *B29C 64/00* | (2017.01) | |
| *B29C 59/02* | (2006.01) | |
| *B81C 99/00* | (2010.01) | |
| *G03F 7/00* | (2006.01) | |
| *H01L 21/027* | (2006.01) | |

(52) U.S. Cl.
CPC ............ *G03F 7/0002* (2013.01); *B29C 59/02* (2013.01); *B81C 99/009* (2013.01); *H01L 21/0271* (2013.01); *B29C 2059/023* (2013.01)

(58) Field of Classification Search
CPC .......... G03F 7/0002; G03F 7/00; B29C 64/00
See application file for complete search history.

(56) References Cited

U.S. PATENT DOCUMENTS

| | | | |
|---|---|---|---|
| 8,394,282 B2 | 3/2013 | Panga et al. | |
| 8,672,661 B2 | 3/2014 | Minoda | |
| 10,580,659 B2 | 3/2020 | Khusnatdinov | |
| 2014/0273523 A1* | 9/2014 | Rathsack | G03F 7/0002 438/781 |

(Continued)

FOREIGN PATENT DOCUMENTS

| | | | |
|---|---|---|---|
| JP | 2011529626 A | 12/2011 | |
| JP | 2012164809 A | 8/2012 | |

(Continued)

OTHER PUBLICATIONS

International Search Report issued in Intl. Appln. No. PCT/JP2020/016325 mailed Jul. 14, 2020.

(Continued)

*Primary Examiner* — Seyed Masoud Malekzadeh
*Assistant Examiner* — Tiffany Yu Huang
(74) *Attorney, Agent, or Firm* — ROSSI, KIMMS & McDOWELL LLP (57) ABSTRACT

A forming apparatus forming a composition on a substrate by using a mold, includes a supplier configured to supply a composition on the substrate, a plurality of processors including a first processor and a second processor, each of the plurality of processors being configured to bring the mold into contact with the composition supplied onto the substrate by the supplier, and a substrate conveyer configured to convey the substrate onto which the composition is supplied by the supplier to the first processor and then convey other substrate onto which the composition is supplied following the substrate to the second processor.

15 Claims, 9 Drawing Sheets

(56) References Cited

U.S. PATENT DOCUMENTS

| | | | | |
|---|---|---|---|---|
| 2015/0355558 A1* | 12/2015 | Miyajima | ........... | G03F 7/70991 |
| | | | | 355/72 |
| 2018/0264691 A1* | 9/2018 | Chang | ...................... | G02B 1/04 |
| 2018/0329294 A1* | 11/2018 | Tsujikawa | ............ | G03F 7/70725 |
| 2019/0080922 A1* | 3/2019 | Khusnatdinov | ... | H01L 21/02345 |
| 2020/0333702 A1 | 10/2020 | Iwatani et al. | | |

FOREIGN PATENT DOCUMENTS

| | | | |
|---|---|---|---|
| JP | 2015012280 | A | 1/2015 |
| JP | 2016149576 | A | 8/2016 |
| JP | 2017022243 | A | 1/2017 |
| JP | 2017120928 | A | 7/2017 |
| JP | 2018006560 | A | 1/2018 |
| JP | 2019051507 | A | 4/2019 |
| KR | 1020180107725 | A | 10/2018 |
| TW | 200303063 | A | 8/2003 |
| TW | 200741905 | A | 11/2007 |
| TW | 200819275 | A | 5/2008 |
| TW | 201038672 | A | 11/2010 |
| TW | 202318482 | A | 5/2023 |
| WO | 2009151560 | A2 | 12/2009 |

OTHER PUBLICATIONS

Written Opinion issued in Intl. Appln. No. PCT/JP2020/016325 mailed Jul. 14, 2020.

* cited by examiner

FORMING APPARATUS, FORMING METHOD, AND ARTICLE MANUFACTURING METHOD

BACKGROUND OF THE INVENTION

Field of the Invention

The present invention relates to a forming apparatus, a forming method, and an article manufacturing method.

Description of the Related Art

As a method of manufacturing an article such as a semiconductor device or MEMS, an imprint method of forming an imprint material on a substrate by using a mold is known. An imprint technique is a microfabrication process for forming a pattern on a cured product onto which a pattern having concave and convex portions is transferred by bringing a mold into contact with an imprint material supplied onto a substrate and applying curing energy to the imprint material.

A technique for planarizing a surface of a substrate by using an imprint apparatus has been proposed (see Japanese Patent Laid-Open No. 2011-529626). Concerning techniques for planarizing a surface of a substrate, there is known a technique for planarizing a step of a surface of a substrate by forming a coating film on the substrate using an existing spin coater. However, this technique is insufficient to planarize the step of a surface of a substrate in nano-scale. On the other hand, the technique disclosed in Japanese Patent Laid-Open No. 2011-529626 is designed to improve planarity by supplying a polymerizable material based on the step of a substrate and curing the polymerizable material while a template having a smooth surface is brought into contact with the polymerizable material.

Figure 1A:
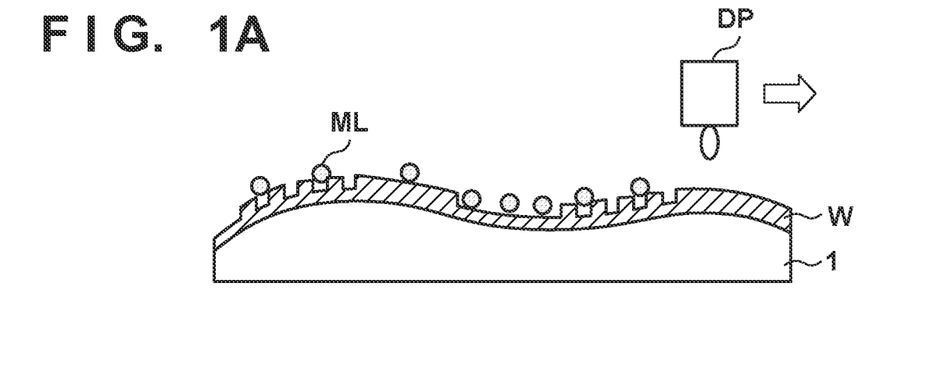
FIGS. 1A to 1D are sectional views showing a planarization process.
Figure 1B:
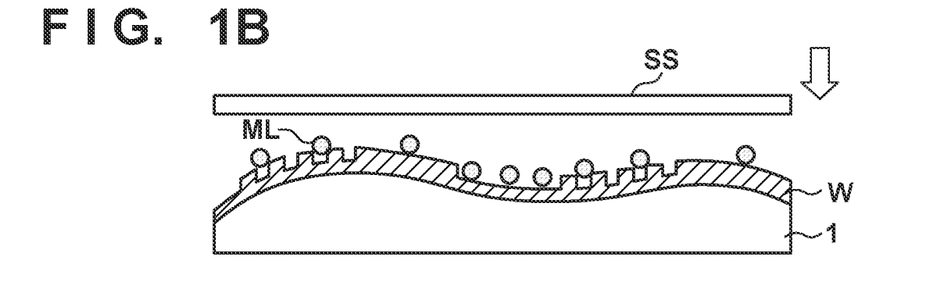
Figure 1C:
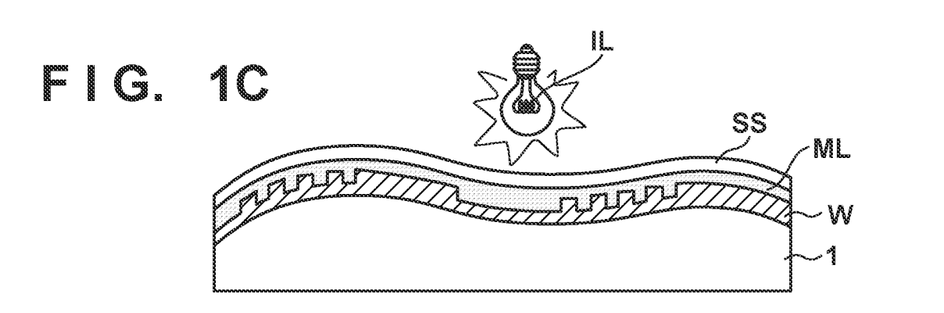
Figure 1D:
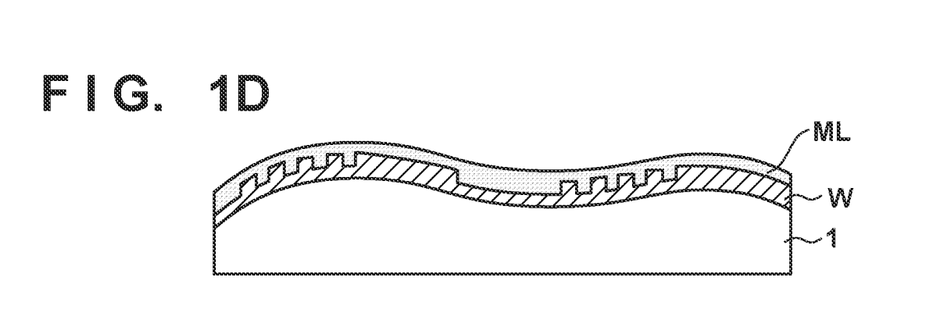

In a planarization process using the imprint apparatus proposed in Japanese Patent Laid-Open No. 2011-529626, a substrate is planarized through a supply step in FIG. 1A, a pressing step in FIG. 1B, a curing step in FIG. 1C, and a mold separation step in FIG. 1D. A planarization apparatus differs from an imprint apparatus in that it brings, as a mold, a flat plate (superstrate) on which no pattern is formed into contact with a composition supplied throughout the entire surface of a substrate to collectively cure the composition.

Accordingly, the curing time of a composition supplied throughout the entire surface of a substrate in the planarization apparatus is longer than that in the imprint apparatus. In addition, the planarization apparatus requires a large amount of curing energy, and the adhesive force acting when a composition supplied throughout the entire surface of a substrate is brought into contact with and separated from a mold is as high as the order of several hundred N. Accordingly, the above pressing step, curing step, and mold separation step each require several 10 sec, and it takes much time for a planarization process per substrate after a composition supply step. If four steps in a planarization process shown in FIGS. 1A to 1D are sequentially processed, the throughput of the planarization apparatus is limited to several 10 substrates per hour at most. In order to improve the productivity of the planarization apparatus, it is required to minimize the processing time for each step or cluster planarization apparatuses to concurrently process a plurality of substrates.

Japanese Patent Laid-Open No. 2016-149576 discloses a processing apparatus in which a plurality of coating processors for applying an organic material onto substrates and a plurality of heating processors for applying heating processes to the substrates are arranged and clustered. If the processors of planarization apparatuses which are configured to perform a composition supply process, mold pressing process, curing process, and mold separation process are clustered, the footprint of the apparatus increases.

SUMMARY OF THE INVENTION

The present invention provides a technique advantageous in reducing the footprint of a clustered forming apparatus.

One of aspects of the present invention provides a forming apparatus that forms a composition on a substrate by using a mold, comprising: a supplier configured to supply a composition on the substrate; a plurality of processors including a first processor and a second processor, each of the plurality of processors being configured to bring the mold into contact with the composition supplied onto the substrate by the supplier; and a substrate conveyer configured to convey the substrate onto which the composition is supplied by the supplier to the first processor and then convey other substrate onto which the composition is supplied following the substrate to the second processor.

Further features of the present invention will become apparent from the following description of exemplary embodiments with reference to the attached drawings.

DESCRIPTION OF THE EMBODIMENTS

Preferred embodiments of the present invention will be described in detail below with reference to the accompanying drawings. The same reference numerals denote the same members in each drawing, and redundant descriptions will be omitted.

First Embodiment

FIGS. 1A to 1D show a planarization process according to the first embodiment. Each of a plurality of steps in the planarization process will be described with reference to FIGS. 1A to 1D. In the planarization process, a substrate can be planarized through a supply step in FIG. 1A, a pressing step in FIG. 1B, a curing step in FIG. 1C, and a mold separation step in FIG. 1D.

In the supply step shown in FIG. 1A, a supplier DP (dispenser) supplies a composition ML as a planarization material onto a surface of a substrate W held by a substrate stage 1. At this time, the supplier DP can supply a composition in a supply amount with a distribution corresponding to the arrangement of a pattern having concave and convex portions formed on a surface of the substrate W.

In the pressing step shown in FIG. 1B, the composition ML is expanded into a layer by bringing a mold (for example, a flat plate or superstrate) SS having an outer diameter equal to or more than that of the substrate W into contact with the composition ML and pressing the mold SS against the entire surface of the substrate W.

In the curing step shown in FIG. 1C, the composition is cured while the mold SS is in contact with the composition ML on the substrate W. This embodiment will exemplify a planarization process of planarizing a substrate by using a photo-curable composition that is cured by ultraviolet light emitted from a light source IL. A planarization apparatus cures the composition ML expanded into a layer by collectively irradiating the entire surface of the substrate W with ultraviolet light from the light source IL.

In the mold separation step shown in FIG. 1D, the substrate W is planarized by separating the mold SS from the composition ML cured on the substrate W. As described above, each step in a planarization process is based on a conventional imprint technique. Repeating each step in the planarization process shown in FIGS. 1A to 1D for each substrate makes it possible to planarize a plurality of substrates.

As described above, a planarization process using the imprint technique is a technique for planarizing a substrate on the nano order by supplying a composition in accordance with the step of the substrate, bringing a flat, thin mold called a superstrate into contact with the supplied composition, and curing the composition.

In the conventional imprint technique generally used in a semiconductor device manufacturing process or the like, the pattern having concave and convex portions formed on a mold is transferred onto an imprint material by repeating an imprint process for each of a plurality of shot regions formed on the substrate. In a planarization process, however, it takes much time for a pressing step, a curing step, and a mold separation step among the above steps. Accordingly, the planarization apparatus according to this embodiment is a cluster of planarization processors that can concurrently execute planarization processes.

Figure 2:
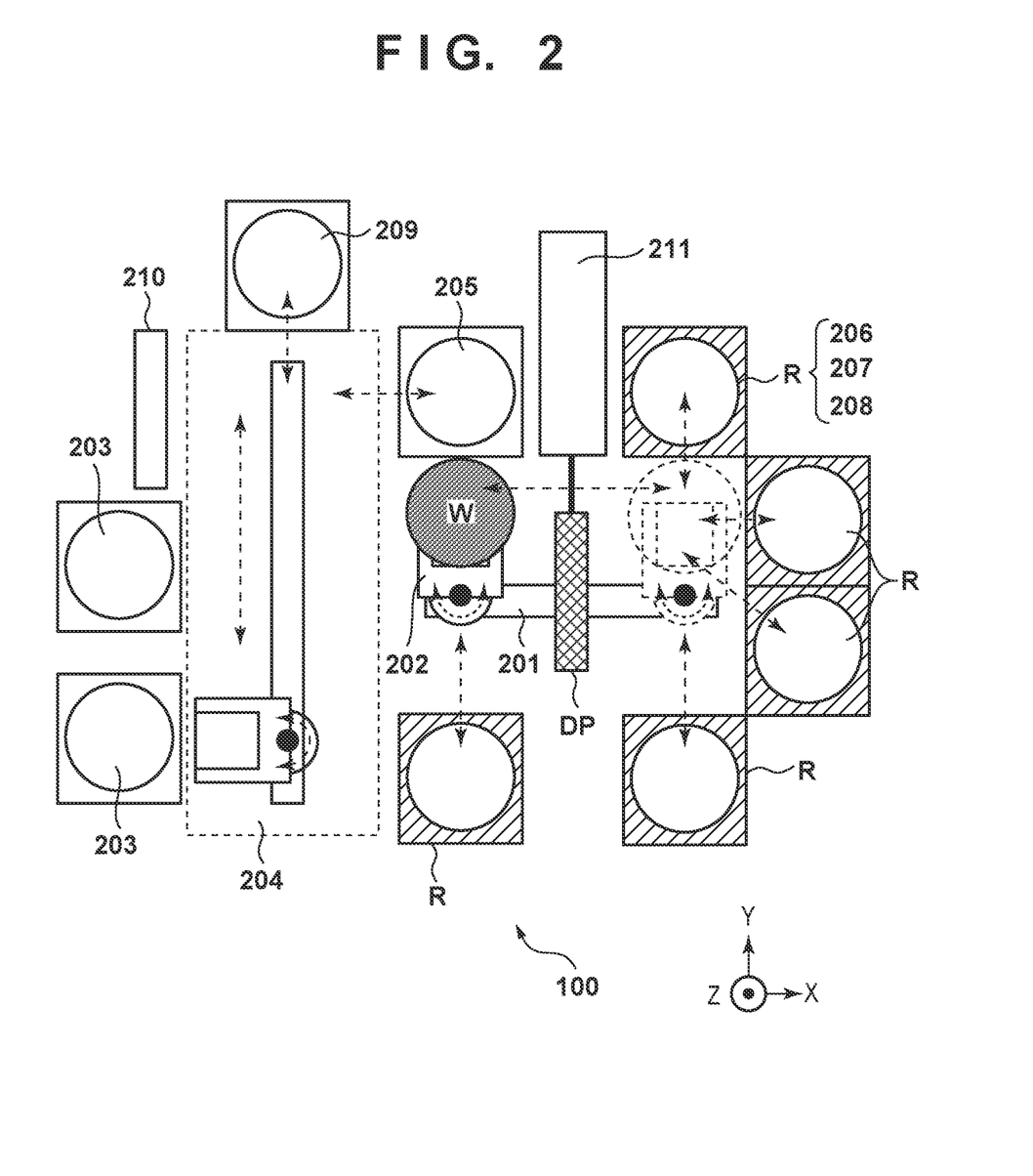
FIG. 2 is an overall view of a planarization apparatus according to the first embodiment.

The planarization apparatus according to the first embodiment will be described with reference to FIG. 2. FIG. 2 shows a planarization apparatus 100 according to the first embodiment. In this case, the respective axes are determined as shown in FIG. 2 assuming that the height direction of the planarization apparatus 100 is a Z direction, and the surface on which the substrate W is placed is an X-Y plane. FIG. 2 shows an X-Y plane when the overall planarization apparatus 100 according to the first embodiment is seen from above.

As shown in FIG. 2, the planarization apparatus 100 according to the first embodiment has a substrate conveying module 204, an alignment station 205, and planarization processors R arranged around a substrate conveyer 201.

The substrate conveying module 204 is also called an EFEM (Equipment Front End Module), and may be formed as part of the planarization apparatus 100, or may be connected as an apparatus different from the planarization apparatus 100 to the planarization apparatus 100. Substrate conveying containers 203, a heating processor 209, and the alignment station 205 are connected to the substrate conveying module 204.

The substrate conveying container 203 is also called a FOUP, which can store a plurality of substrates and load and unload substrates. The substrate conveying container 203 can convey substrates between the planarization apparatus 100 and an apparatus different from the planarization apparatus 100. The substrate conveying module 204 loads substrates stored in the substrate conveying container 203 into the planarization apparatus 100.

The alignment station 205 measures the position of the substrate W, conveyed from the substrate conveying container 203 by the substrate conveying module 204, in a rotation direction Oz with respect to the Z-axis and adjusts the temperature of the substrate W. The substrate conveying module 204 conveys the substrate W stored in the substrate conveying container 203 to the alignment station 205. For example, the alignment station 205 can measure the position of the substrate W in the rotation direction Oz by measuring a notch (notch portion) formed in the substrate W. The substrate W is aligned with respect to the substrate conveyer 201 based on the measurement result obtained by the alignment station 205.

The heating processor 209 can perform a baking process (heating process) and a cleaning process for the substrate W. The heating processor 209 may be formed as part of the planarization apparatus 100 or may be connected as an apparatus different from the planarization apparatus 100 to the planarization apparatus 100.

The planarization processors R internally and sequentially execute a plurality of steps in the planarization process shown in FIGS. 1B to 1D. The planarization apparatus 100 according to this embodiment executes the coating step shown in FIG. 1A before a substrate is loaded into the planarization processor R, and hence the planarization processor R does not execute a coating step. Accordingly, each planarization processor R has the superstrate SS as a mold inside, and includes the substrate stage 1 holding the substrate W, but does not include the supplier DP. Alternatively, each planarization processor R may individually include a mold pressing processor 206 that executes a pressing step, a curing processor 207 that executes a curing step, and a mold separation processor 208 that executes a mold separation step. These processors may sequentially execute a planarization process. Although the planarization apparatus 100 shown in FIG. 2 has the plurality of planarization processors R arranged in an X-Y plane. However, the plurality of planarization processors R may be stacked on each other in the Z direction (vertical direction).

The substrate conveyer 201 includes a substrate holder 202 that holds the substrate W. The substrate conveyer 201 includes a driving mechanism that moves the substrate W in a translation direction (X-Y direction), a vertical direction (Z direction), and a rotation direction (Oz direction) by using the substrate holder 202, and can move the substrate W to an arbitrary place. The substrate conveyer 201 receives the substrate W from the alignment station 205 and conveys the substrate W to the plurality of planarization processors R by using the translation, vertical, and rotational moving mechanism.

In the planarization apparatus 100 according to this embodiment, the supplier DP that supplies the composition ML onto the substrate W is arranged at a given position on a path on which the substrate W is conveyed from the alignment station 205 to the planarization processor R. FIG. 2 exemplarily shows the planarization apparatus 100 that has the supplier DP arranged immediately above the substrate conveyer 201. With this arrangement, while the substrate W held by the substrate holder 202 is conveyed by the substrate conveyer 201, the supplier DP can supply the composition ML onto the substrate W.

The arrangement position of the supplier DP is not limited to the position immediately above the substrate conveyer 201. For example, the supplier DP may be arranged in the substrate conveying module 204. In this case, the supplier DP supplies the composition ML onto the substrate W at a given position on the path on which the substrate W unloaded from the substrate conveying container 203 is conveyed to the alignment station 205. The alignment station 205 measures the position of the substrate W onto which the composition ML has been supplied. The substrate conveyer 201 then conveys the substrate W to the planarization processor R.

The supplier DP is also called a dispenser, which is connected to a circulator 211. The circulator 211 can always circulate the composition ML from a storage tank to the discharge surface of the supplier DP by using a plurality of pumps in order to maintain constant the physical properties of the composition ML, the wettability of the discharge surface of the supplier DP, and the internal pressure.

As the composition ML used by the planarization apparatus 100, a curable composition (to be also referred to as a resin in an uncured state) to be cured by receiving the curing energy is used. Examples of the curing energy are an electromagnetic wave, heat, and the like. As the electromagnetic wave, for example, light which is selected from the wavelength range of 10 nm (inclusive) to 1 mm (inclusive) and includes infrared light, a visible light beam, and ultraviolet light is used.

The curable composition is a composition cured with light irradiation or heating. The photo-curable composition cured by light irradiation contains at least a polymerizable compound and a photopolymerization initiator, and may contain a non-polymerizable compound or a solvent, as needed. The non-polymerizable compound is at least one material selected from the group consisting of a sensitizer, a hydrogen donor, an internal mold release agent, a surfactant, an antioxidant, and a polymer component.

The composition ML may be applied in a film shape onto the substrate by a spin coater or a slit coater as the supplier DP. The composition ML may also be applied, onto the substrate, in the form of droplets or in the form of an island or film obtained by connecting a plurality of droplets using a liquid injection head. The viscosity (the viscosity at 25° C.) of the composition ML is, for example, 1 mPa·s (inclusive) to 100 mPa·s (inclusive).

As the substrate W, glass, a ceramic, a metal, a semiconductor, a resin, or the like is used. A member made of a material different from the substrate may be formed on the surface of the substrate, as needed. More specifically, the substrate includes a silicon wafer, a compound semiconductor wafer, silica glass, and the like.

The planarization apparatus 100 can include a controller 210 (a console and a controller) that controls the operation of each unit. The controller 210 can control a series of sequences in a planarization process for the substrate W by performing the conveyance control of the substrate W, the supply control of a composition by the supplier DP, and the operation control of each planarization processor R. The controller 210 may be provided in the planarization apparatus 100 or may be installed in a location different from that of the planarization apparatus 100 so as to be remotely controlled.

It is also possible to repeat a planarization process from the step in FIG. 1A to the step in FIG. 1D with respect to the single substrate W a plurality of times. Post-steps in semiconductor manufacturing steps can include a process of applying high heat to the substrate W when performing plasma etching, coating, cleaning, ion implantation, or the like. After the substrate W is temporarily planarized, the composition ML may undergo contraction or strain relaxation due to the heat applied in a post-step. This may reduce the flatness of the substrate W again. It is not efficient to perform a planarization process for the substrate W every time the flatness of the substrate W decreases. For this reason, the planarization apparatus 100 preferably includes the heating processor 209 to perform a heat cycle immediately after a planarization process so as to convey the substrate W to a subsequent step immediately after causing contraction and strain relaxation of the composition ML on the substrate W in advance.

The heating processor 209 may incorporate a plurality of heating processors. For example, the heating processor 209 may execute baking and cleaning with respect to a predetermined number of substrates W by a batch scheme upon stacking the substrates W at predetermined intervals in the vertical direction. This can directly convey the substrates W, returned to the substrate conveying module 204, to the heating processor 209, thereby flexibly coping with a substrate process for each user, for example, baking at about 250° C. to 400° C. and rapid cooling.

The composition ML used in a planarization process is a curable composition, which can be highly volatile. The volatilization of the composition ML can have influence on variations in planarization performance concerning the thickness and step after a planarization process. For this reason, after a composition is supplied onto a substrate, it is preferable to prevent the substrate from being set in a standby state (in which the composition greatly volatilizes) without any treatment inside the planarization apparatus. That is, in the planarization apparatus configured to process a plurality of substrates, scheduling is preferably performed such that the volatilization times of the compositions ML in planarization processes become the same among the respective substrates.

In order to equalize the volatilization times among a plurality of substrates, for example, the same number of suppliers DP as that of planarization processors R that perform planarization processes may be arranged in the planarization apparatus 100 to equalize the processing times from the supply of compositions to mold pressing. However, increasing the number of suppliers DP (dispensers) may increase the size of the planarization apparatus 100 and variations in discharge performance concerning discharge direction, speed, discharge amount, and wettability, caused by the instability, individual differences, and temporal changes of nozzles themselves among a plurality of substrates. For this reason, as described above, in the planarization apparatus 100 according to this embodiment, the common supplier DP is arranged for the plurality of processors that can perform concurrent processes. The basic layout of the planarization apparatus 100 according to the first embodiment has been exemplarily described so far.

Figure 3:
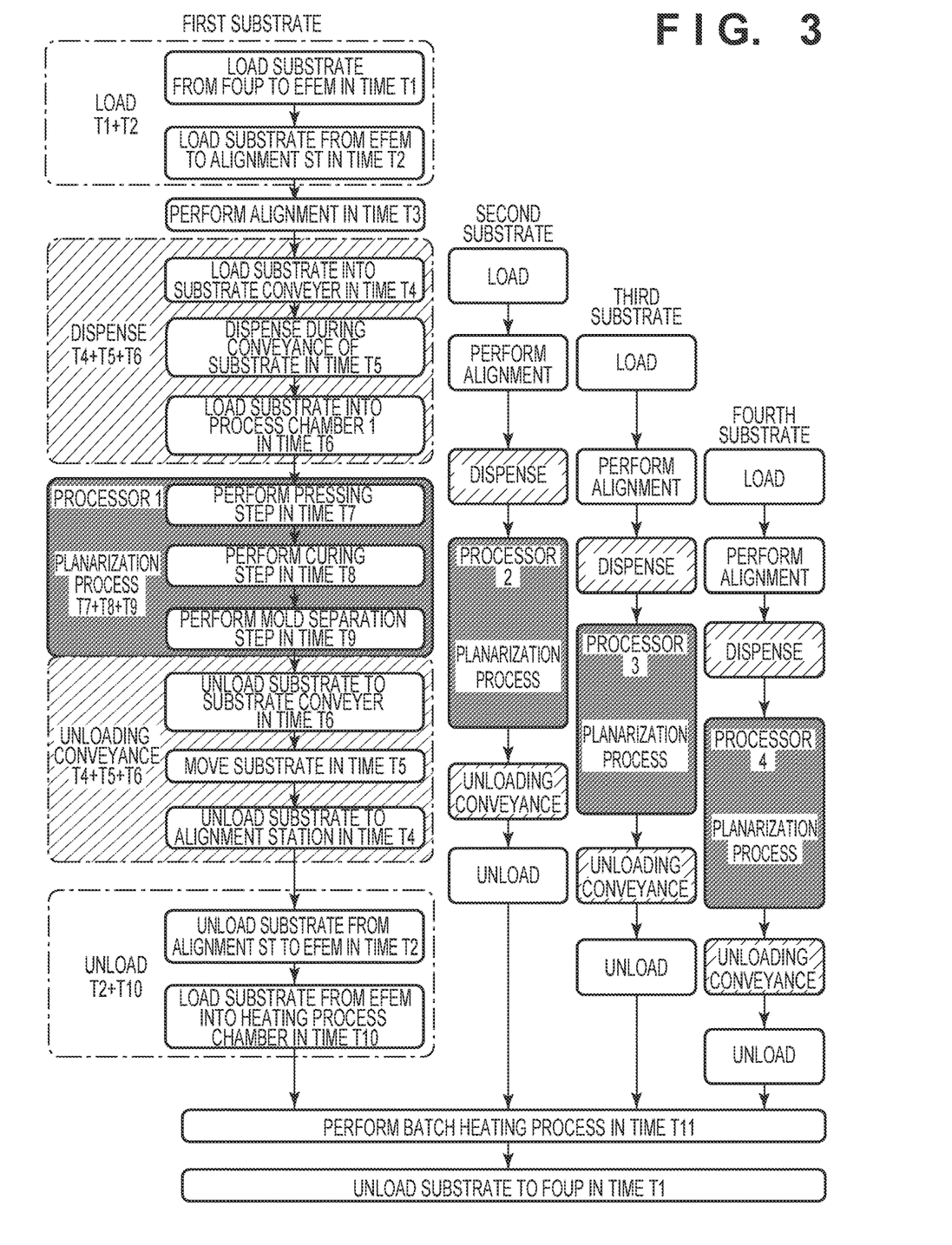
FIG. 3 is a flowchart showing steps in a planarization process according to the first embodiment.

The following will describe a planarization process method for equalizing the processing times from the supply step in FIG. 1A to the pressing step in FIG. 1B among a plurality of substrates by using the planarization apparatus 100. FIG. 3 is a flowchart showing steps in a planarization process by the planarization apparatus 100. As shown in FIG. 3, a process flow for one substrate W can include a loading step, an alignment step, a dispensing step, a planarization process, an unloading conveyance step, and an unloading step. The process flow can be executed in this order.

The loading step can include a time T1 for loading the substrate W from the substrate conveying container 203 (FOUP) to the substrate conveying module 204 (EFEM) and a time T2 for loading the substrate W from the substrate conveying module 204 to the alignment station 205. The execution of the loading step can require a time T1+T2.

The alignment step can include a step of aligning the substrate W on the alignment station 205. The execution of the alignment step can require a time T3.

The dispensing step can include a step of causing the supplier DP to supply the composition ML onto a surface of the substrate W while the substrate conveyer 201 unloads the substrate W from the alignment station 205 and conveys the substrate W to the planarization processor R. The dispensing step can include a time T4 for causing the substrate conveyer 201 to unload a substrate from the alignment station 205, a time T5 for conveying the substrate W to the planarization processor R while supplying the composition ML, and a time T6 for loading the substrate W into the planarization processor R. The execution of the dispensing step can require a time T4+T5+T6.

The planarization processors R can sequentially execute a planarization process. The planarization process can include a time T7 for a pressing step, a time T8 for a curing step, and a time T9 for a mold separation step. The execution of the planarization process can require a time T7+T8+T9. This time is the time during which the substrate W stays in the planarization processor R. The planarization processor R performs a planarization process for the first substrate. When a series of steps in the planarization process are completed, the substrate W can be conveyed to the substrate conveying container 203 and recovered (unloaded).

Assume that the unloading conveyance step includes the time T6 taken for the substrate conveyer 201 to unload the substrate W from the planarization processor R, the time T5 for conveying the substrate W to the alignment station 205, and the time T4 for unloading the substrate W to the alignment station 205. In this case, the execution of the unloading conveyance step requires a time T4+T5+T6. Assume that the time taken for the unloading conveyance step is equivalent to the time required for the dispensing step. The time for the unloading conveyance step may be adjusted by a conveying method.

Finally, the unloading step can include the time T2 for unloading a substrate W from the alignment station 205 to the substrate conveying module 204 and a time T10 for transferring the substrate W from the substrate conveying module 204 to the heating processor 209. The execution of the unloading step can require a time T2+T10.

Accordingly, a total time T required for processing the single substrate W in the planarization apparatus 100 can be $$T=T1+T3+2\times(T2+T4+T5+T6)+T7+T8+T9+T10 \quad (1)$$

Assume that a planarization process is to be executed for each of a plurality of substrates by taking the time T described above. In this case, this procedure takes much time, and hence is not practical. The planarization apparatus according to this embodiment sequentially performs planarization processes for the second and subsequent substrates W concurrently with a planarization process for the first substrate W.

For example, as shown in FIG. 3, while the first substrate W stays in the alignment step, a loading step is executed with respect to the second substrate W. Subsequently, while the first substrate W stays in the dispensing step, an alignment step is executed for the second substrate W, and a loading step is executed for the third substrate W. While the first substrate W is conveyed to the first processor and subjected to a planarization process, a dispensing step and a planarization step are executed for the second substrate W, and an alignment step and a loading step are respectively executed for the third and fourth substrates W. At this time, the second substrate W (the substrate different from the first substrate) is conveyed to the second processor and is subjected to a planarization process, and hence the first and second substrates can be concurrently processed (processed simultaneously). The plurality of substrates W can be concurrently processed by making scheduling to sequentially process the substrates in this manner.

Although it is ideal to perfectly concurrently process the plurality of substrates W within the time T, the scheduling for the planarization process shown in FIG. 3 requires an additional unloading time T2+T10 for each of the plurality of substrates. Accordingly, it takes a time N×(T2+T10)+T to perform planarization processes for the N substrates W. The processing time can be shortened as compared with a case in which one processor sequentially processes N substrates.

In this case, scheduling is preferably made such that it takes a predetermined time to execute each dispensing step throughout the plurality of substrates W (it takes the same time among the plurality of substrates W). That is, the planarization apparatus 100 according to this embodiment can equalize the times taken from the supply step in FIG. 1A to the pressing step in FIG. 1B among a plurality of substrates by using the system arrangement in which after the supplier DP supplies a composition onto each substrate, the substrates are concurrently supplied to the plurality of planarization processors R. In this manner, executing the above planarization processes by using the planarization apparatus according to the first embodiment can prevent an increase in the size of the planarization apparatus even when processing a plurality of substrates. In addition, controlling the planarization apparatus to take a constant time for a planarization process throughout a plurality of substrates can suppress variations in planarization performance.

The planarization apparatus and the planarization method according to this embodiment can suppress variations in planarization performance among a plurality of substrates when planarizing the plurality of substrates, thereby providing a planarization apparatus with improved productivity.

Second Embodiment

A planarization apparatus 101 according to the second embodiment will be described next based on FIG. 4. In order to further improve the productivity of the planarization apparatus 100 according to the first embodiment, it is preferable to increase the number of processors to be clustered while minimizing an increase in footprint.

Figure 4:
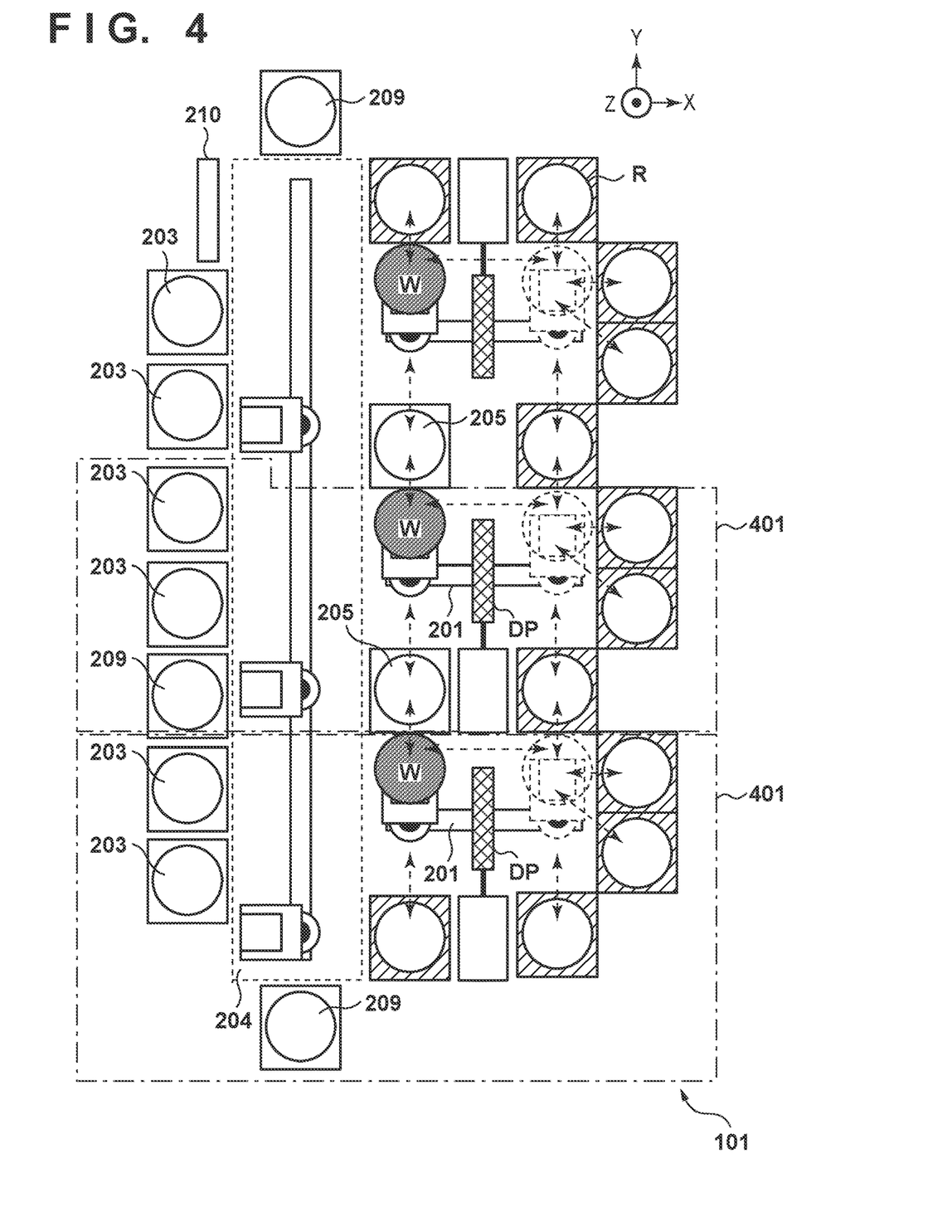
FIG. 4 is an overall view of a planarization apparatus according to the second embodiment.

FIG. 4 shows the overall planarization apparatus 101 when planarization apparatuses each identical to the planarization apparatus according to the first embodiment are clustered. The same reference numerals as those of the planarization apparatus 101 in FIG. 2 denote the same members as those of the planarization apparatus 101 in FIG. 4, and redundant descriptions will be omitted.

In the planarization apparatus 101 according to the second embodiment, for example, a substrate conveying module 204 extends in the −Y direction, and additional stations 401 surrounded by the dotted lines are arranged. This apparatus may include the single additional station 401 or a plurality of additional stations as exemplarily shown in FIG. 4. Each additional station 401 can include a substrate conveyer 201 and a supplier DP. In addition, a plurality of planarization processors R can be arranged around each substrate conveyer 201. Obviously, an additional station 401 may be added in the +Y direction.

It is possible to prevent an increase in the footprint of the planarization apparatus 101 according to the second embodiment by sharing an alignment station 205 and a heating processor 209 between a plurality of process stations. In addition, many additional stations 401 can be physically arranged in the ±Y direction if no consideration is given to footprint at the installation location of the apparatus. According to the second embodiment, it is possible to improve productivity while suppressing an increase in the size of the planarization apparatus 101.

Third Embodiment

Figure 5:
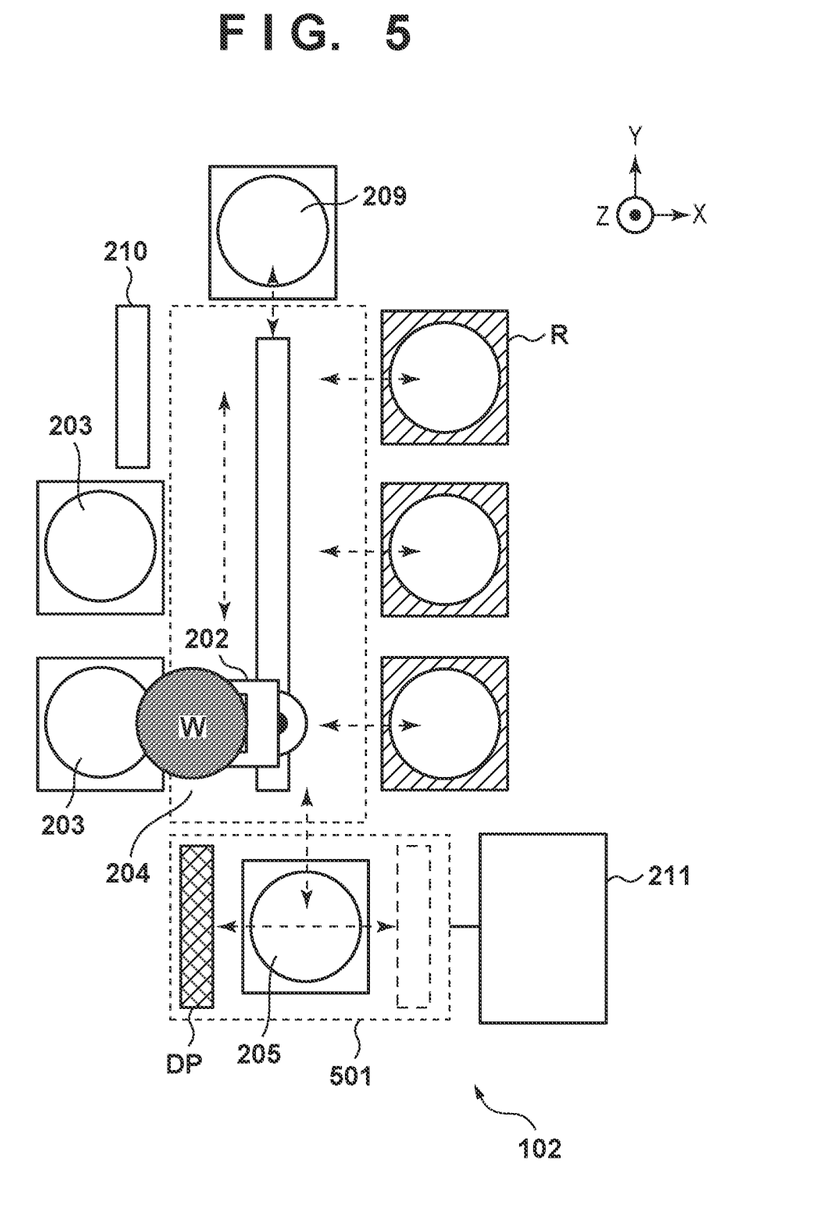
FIG. 5 is an overall view of a planarization apparatus according to the third embodiment.

A planarization apparatus 102 according to the third embodiment will be described next with reference to FIG. 5. As shown in FIG. 5, in the planarization apparatus 102 according to the third embodiment, a plurality of substrate conveying containers 203, a heating processor 209, a supply station 501, and a plurality of planarization processors R are arranged around a substrate conveying module 204.

The supply station 501 according to the third embodiment includes an alignment station 205 and a supplier DP. The supplier DP is arranged above the alignment station 205. The supplier DP is connected to a circulator 211 like the supplier of the planarization apparatus 100 according to the first embodiment.

The substrate conveying module 204 conveys a substrate W unloaded from the substrate conveying container 203 to the supply station 501 (loading step). The alignment station 205 is fixed in the supply station 501. The supplier DP can supply a composition ML onto a surface of the substrate W by applying the composition ML while moving in the ±x direction. In contrast to this, the alignment station 205 may also serve as the substrate conveyer 201 or a substrate stage 1 in the first embodiment so as to allow the supplier DP to supply the composition ML onto a surface of the substrate W while moving in the ±X direction. At this time, the supplier DP may apply the composition ML while being fixed or apply the composition ML while moving in a direction opposite to the alignment station 205. Alternatively, after the alignment station 205 measures the position of the substrate W, a composition may be supplied onto a surface of the substrate W while the substrate holder 202 (conveying hand) of the substrate conveying module 204 holds the substrate W.

After the supply station 501 completes a supply step (dispensing step), the substrate conveying module 204 conveys the substrate W to the planarization processor R. Thereafter, as in the first embodiment, the planarization processor R executes a planarization process like that shown in FIGS. 1A to 1D with respect to the substrate W. Upon completion of the planarization process for the substrate W, the substrate conveying module 204 conveys the substrate W to the heating processor 209 again. The heating processor 209 may sequentially perform a heating process for the substrate W having undergone a planarization process or may collectively perform a heating process for a predetermined number of substrates. A planarization process for the plurality of substrates W is executed in accordance with the procedure for the planarization process described in the first embodiment.

As described above, as in the first embodiment, the planarization apparatus 102 according to the third embodiment is configured to concurrently supply substrates from one supplier to a plurality of planarization processors R. In addition, the planarization apparatus 102 can equalize the processing times from the supply step in FIG. 1A to the pressing step in FIG. 1B with respect to the respective substrates W.

According to the third embodiment, arranging the supplier DP on the alignment station 205 makes it possible to suppress an increase in the size of the planarization apparatus 100 and improve the productivity. In the planarization apparatus 102 according to the third embodiment, the substrate conveying module 204 directly transfers substrates to the plurality of planarization processors R, and hence the substrate conveyer 201 is not required. This makes it possible to shorten the time taken to convey each substrate W.

Fourth Embodiment

A planarization apparatus 103 according to the fourth embodiment will be described based on FIG. 6. Like the planarization apparatus 100 according to the first embodiment, the planarization apparatus 102 according to the third embodiment is preferably configured to increase the number of processors to be clustered while minimizing an increase in footprint in order to further improve the productivity.

Figure 6:
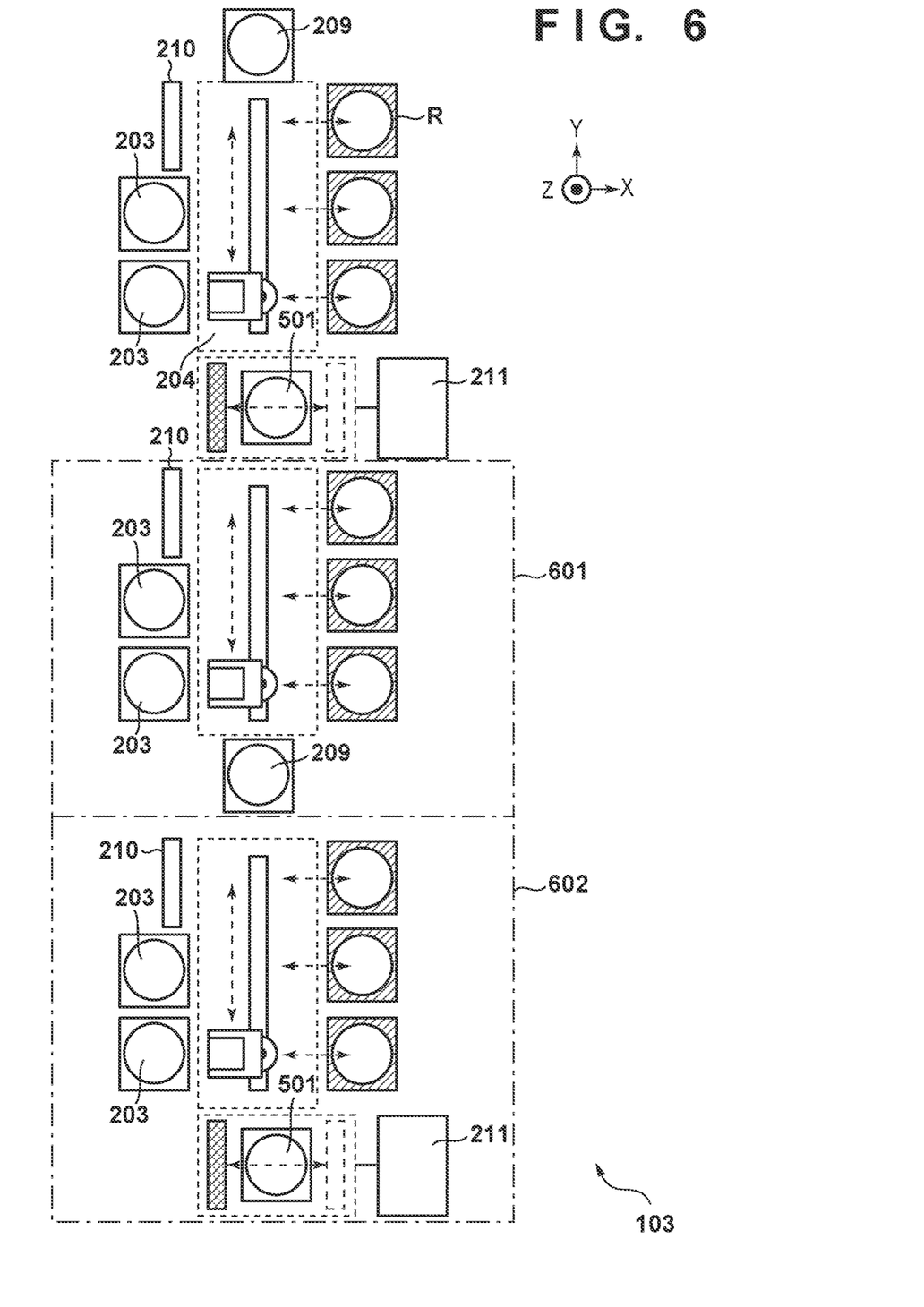
FIG. 6 is an overall view of a planarization apparatus according to the fourth embodiment.

FIG. 6 shows the overall arrangement of the planarization apparatus 103 when planarization apparatuses each identical to that according to the third embodiment are clustered. The same reference numerals as those of the planarization apparatus in FIG. 5 denote the same members as those of the planarization apparatus 103 in FIG. 6, and redundant descriptions will be omitted.

In the planarization apparatus 103 according to the fourth embodiment, for example, an additional station 601 surrounded by the dotted line is arranged. This apparatus may include the single additional station 601 or a plurality of additional stations as exemplarily shown in FIG. 6. The additional station 601 can include a substrate conveying module 204. In addition, a plurality of planarization processors R can be arranged around each substrate conveying module 204. Obviously, an additional station 601 may be added in the +Y direction.

It is possible to prevent an increase in the footprint of the planarization apparatus 103 according to the fourth embodiment by sharing a supply station 501 and a heating processor 209 between a plurality of process stations. When compared with the planarization apparatus 102 according to the third embodiment, the additional station 601 of the planarization apparatus 103 according to the fourth embodiment is configured to share the supply station 501 at the connection destination and additionally include the heating processor 209. In addition, when compared with the planarization apparatus 102 according to the third embodiment, an additional station 602 is configured to share the heating processor 209 at the connection destination and additionally include the supply station 501.

In addition, many additional station 601 and additional stations 602 can be physically arranged in the ±Y direction if no consideration is given to footprint at the installation location of the apparatus. The planarization apparatus 103 according to the fourth embodiment can provide a planarization apparatus that suppresses an increase in size and has improved productivity when performing a planarization process for a plurality of substrates.

Fifth Embodiment

Figure 7:
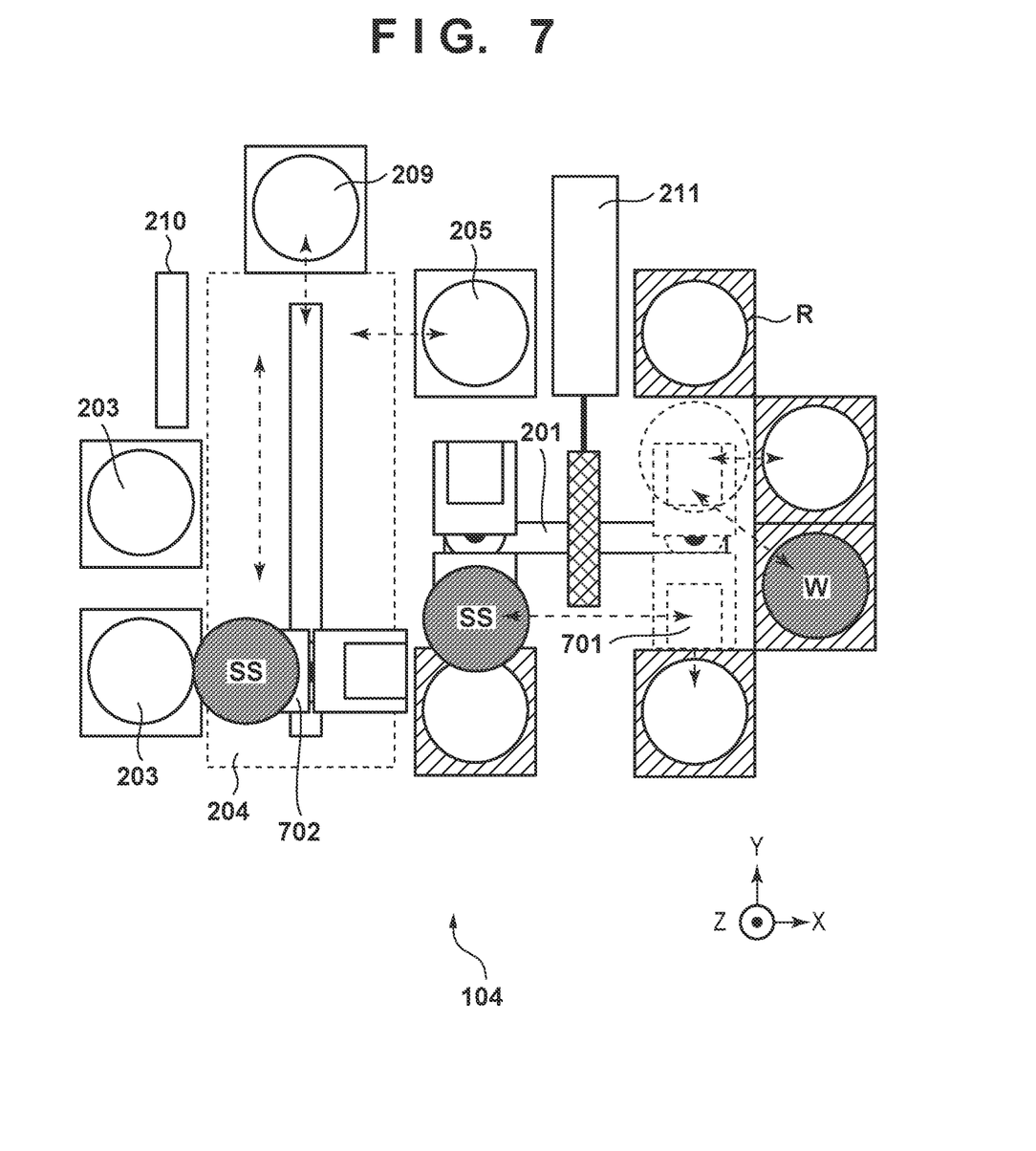
FIG. 7 is an overall view of a planarization apparatus according to the fifth embodiment.

A planarization apparatus 104 according to the fifth embodiment will be described next based on FIG. 7. As shown in FIG. 7, the planarization apparatus 104 according to the fifth embodiment can be configured to include a mechanism for replacing a mold (superstrate) SS used by a planarization processor R in addition to the basic arrangement of the planarization apparatus 100 according to the first embodiment. The planarization apparatus 104 according to the fifth embodiment can include a substrate conveyer 201, a substrate holder 202, and a mold holder 701.

As the mold holder 701 holding the mold SS, a known Bernoulli hand or edge grip hand can be used. In this case, the mold holder 701 preferably holds the mold SS so as to inhibit the mold SS from coming into contact with a surface (pressing surface) that comes into contact with a composition ML.

The mold SS is conveyed from a substrate conveying container 203 to the mold holder 701 via the same conveying route as that for the substrate W. Accordingly, it is preferable that a conveying hand in a substrate conveying module 204 and an alignment station 205 also include mold holders 702 and a mold is conveyed from the substrate conveying container 203 to the planarization processor R without contact with the pressing surface. The substrate conveyer 201 conveys the mold SS held by the mold holder 701 to each planarization processor R. A replacing mechanism inside the planarization processor R can replace the mold SS. In order to prevent a reduction in the throughput of a planarization process during the operation of the planarization apparatus 104, replacement of the mold SS is executed while the substrate W is processed in the planarization processor R different from a replacement target or the heating processor 209.

Sixth Embodiment

Figure 8:
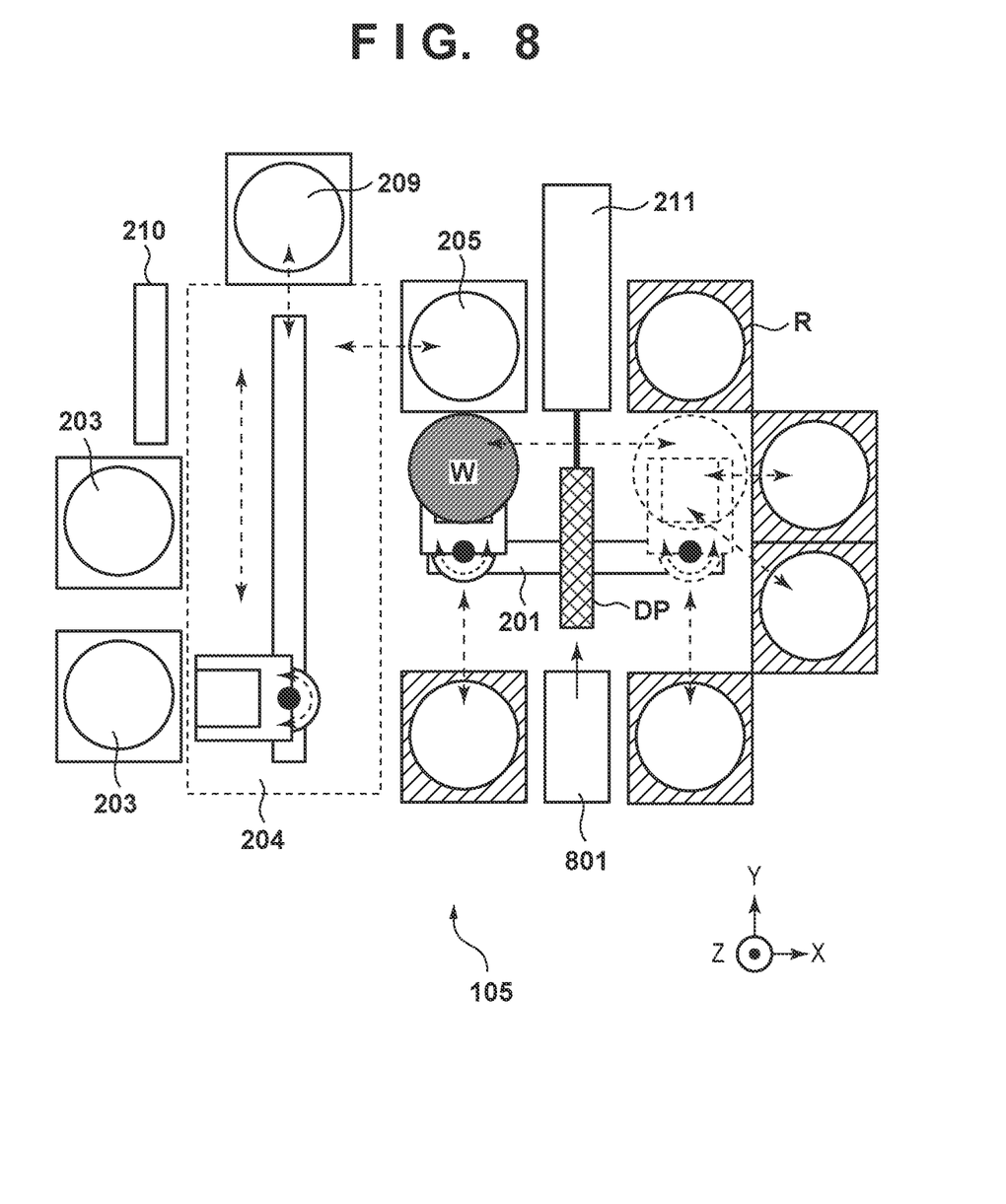
FIG. 8 is an overall view of a planarization apparatus according to the sixth embodiment.

A planarization apparatus 105 according to the sixth embodiment will be described next based on FIG. 8. As shown in FIG. 8, the planarization apparatus 105 according to the sixth embodiment can be configured to include a mechanism for periodically discharging a composition from a supplier DP in addition to the basic arrangement of the planarization apparatus 100 according to the first embodiment. In the planarization apparatus 105 according to the sixth embodiment, a discharge tray 801 is arranged near the supplier DP.

The volatility of a composition ML is high, and the discharge surface of the supplier DP is always unstable. In addition, the discharge performance of the nozzle of the supplier DP itself concerning a discharge direction, speed, discharge amount, and wettability can change over time. For this reason, in order to maintain the discharge performance of the nozzle that discharges a composition, a composition is periodically discharged in some case. The supplier DP can discharge a composition to the discharge tray 801 different from a substrate W.

The planarization apparatus 105 according to the sixth embodiment is provided with the discharge tray 801. When the supplier DP is configured to periodically discharge a composition, the discharge tray 801 may be arranged immediately below the supplier DP or the supplier DP may move to a position immediately above the discharge tray 801. When the supplier DP is configured to periodically discharge a composition, the supplier DP may discharge a larger amount of composition than when supplying a composition onto a substrate. This makes it possible to stably maintain the discharge performance of the nozzle of the supplier DP.

The above embodiment has exemplified the planarization apparatus 100 as a forming apparatus, which planarizes a composition on a substrate by using, as a mold SS, a flat plate called a superstrate having a flat surface portion on which no pattern is formed. However, a forming apparatus is not limited to a planarization apparatus and may be an imprint apparatus that uses a mold having a pattern portion on which a pattern having concave and convex portions is formed, and forms the pattern on an imprint material on a substrate.

In this case, a mold is used to form an imprint material on a substrate. A mold can also be called a template or original plate. A mold has a rectangular outer shape and a pattern surface (first surface) on which a pattern (pattern having concave and convex portions) to be transferred onto the substrate W (an imprint material on it) is formed. A mold is formed from a material that transmits ultraviolet light for curing an imprint material on a substrate, for example, quartz. The pattern surface of a mold has a mold-side mark functioning as an alignment mark.

The above description has been made on a planarization apparatus or imprint apparatus as the above forming apparatus, which uses the method of curing a composition or imprint material by using a photo-curing method. However, each embodiment may use a method of curing a composition or imprint material by using heat in place of the photo-curing method.

The photo-curing method uses an ultraviolet curable resin and forms a pattern by irradiating the resin with ultraviolet light while a substrate is pressed against a mold through the resin, and separating the mold from the cured resin. The above embodiment is configured to apply ultraviolet light as curing light. However, it is possible to determine the wavelength of light, as needed, in accordance with a composition or imprint material supplied onto the substrate W.

In contrast to this, the method using heat is configured to form a pattern by heating a thermoplastic resin to a temperature equal to or higher than the glass-transition temperature, pressing a substrate against a mold through the resin while the fluidity of the resin is improved, and separating the mold from the resin after cooling.

As shown in FIG. 1D, the imprint apparatus may form a pattern of a cured product on a substrate whose surface is planarized by the planarization apparatus 100 described above. A method of forming a pattern of a cured product on a substrate by using the imprint apparatus will be described below.

The pattern of a cured resultant formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured resultant is directly used as the constituent member of at least some of the above-described articles or used temporarily as a resist mask. After etching or ion implantation is performed in the substrate processing step, the resist mask is removed.

Figure 9A:
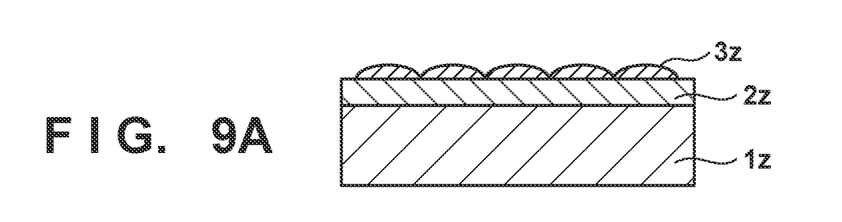
FIGS. 9A to 9F are sectional views for explaining an article manufacturing method.

A more specific method of manufacturing an article will be described next. As shown in FIG. 9A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 9B:
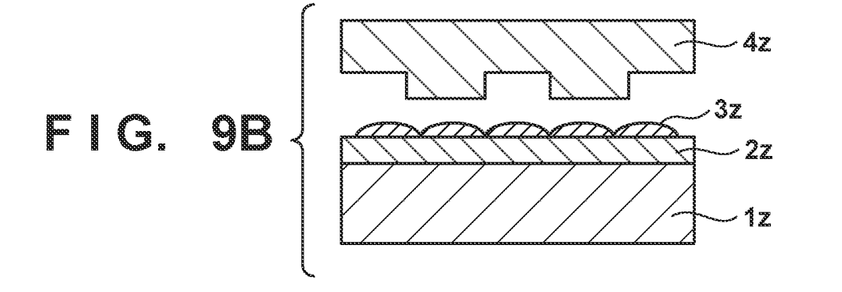
Figure 9C:
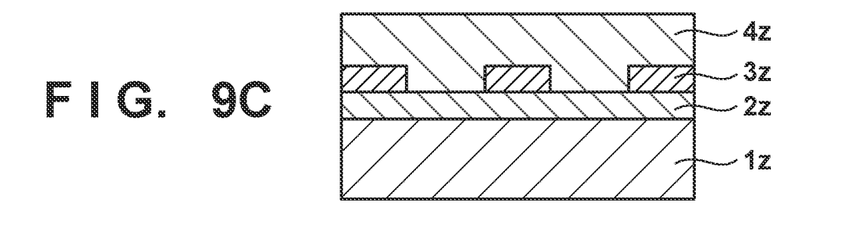

As shown in FIG. 9B, a side of a mold $4z$ for imprint with an uneven pattern is directed to and caused to face the imprint material $3z$ on the substrate. As shown in FIG. 9C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with energy for curing via the mold $4z$, the imprint material $3z$ is cured.

Figure 9D:
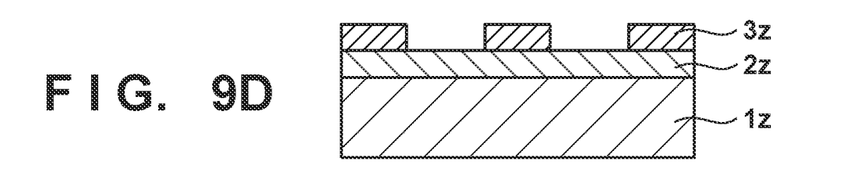

As shown in FIG. 9D, after the imprint material $3z$ is cured, the mold $4z$ is separated from the substrate $1z$. Then, the pattern of the cured resultant of the imprint material $3z$ is formed on the substrate $1z$. In the pattern of the cured resultant, the concave portion of the mold corresponds to the convex portion of the cured resultant, and the convex portion of the mold corresponds to the concave portion of the cured resultant. That is, the uneven pattern of the mold $4z$ is transferred to the imprint material $3z$.

Figure 9E:
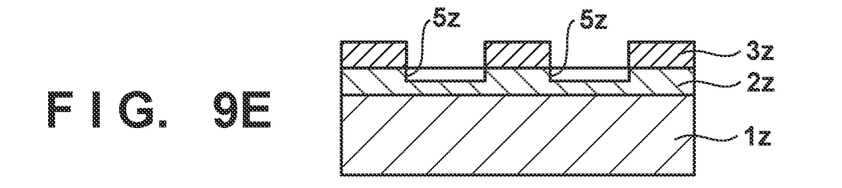
Figure 9F:
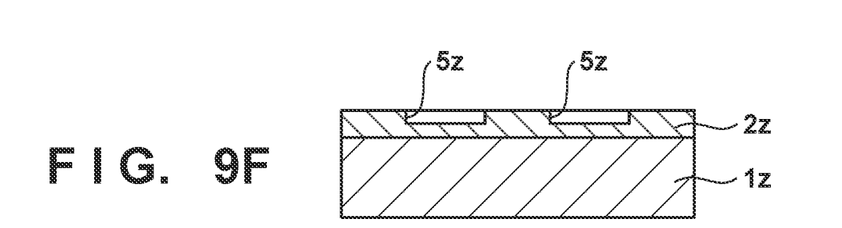

As shown in FIG. 9E, when etching is performed using the pattern of the cured resultant as an etching resistant mold, a portion of the surface of the processed material $2z$ where the cured resultant does not exist or remains thin is removed to form a groove $5z$. As shown in FIG. 9F, when the pattern of the cured resultant is removed, an article with the grooves $5z$ formed in the surface of the processed material $2z$ can be obtained. Here, the pattern of the cured resultant is removed. However, instead of processing or removing the pattern of the cured resultant, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A forming apparatus, comprising:
 a supplier configured to supply a composition on each of a plurality of substrates including a first substrate and a second substrate;
 a plurality of processors including a first processor and a second processor, the first processor being configured to bring a first mold into contact with the composition supplied onto the first substrate, the second processor being configured to bring a second mold into contact with the composition supplied onto the second substrate;
 an alignment station shared by the plurality of processors and configured to align a position of each of the plurality of substrates; and
 a substrate conveyer configured to convey each of the plurality of substrates, whose position is aligned in the alignment station through a conveying path shared by the plurality of processors, to a processor selected from the plurality of processors through a conveying path, and convey the substrate processed by the processor selected from the plurality of processors to the alignment station,
 wherein the supplier supplies, at a position on the conveying path, the composition onto the first substrate while the first substrate is being conveyed to the first processor by the substrate conveyer, and the supplier supplies, at the position on the conveying path, the composition onto the second substrate while the second substrate is being conveyed to the second processor by the substrate conveyer;
 wherein the substrate conveyer is further configured to convey the first substrate onto which the composition is supplied by the supplier to the first processor through the conveying path and then convey the second substrate onto which the composition is supplied by the supplier to the second processor through the conveying path, and
 wherein the plurality of processors including the first processor and the second processor are disposed separate and apart from the substrate conveyor.

2. The apparatus according to claim 1, wherein the forming apparatus is an apparatus configured to form a composition on the plurality of substrates, and times taken by the substrate conveyer to convey each of the plurality substrates to any one of the plurality of processors since supply of the composition onto the plurality substrates are equal to each other between the plurality of substrates.

3. The apparatus according to claim 1, further comprising:
 a heating processor configured to perform a heating process for each of the plurality substrates after the processor cures the composition on each of the plurality substrates; and
 a substrate conveying module configured to convey each of the plurality of substrates to be processed by selected one of the plurality of processors to the alignment station, and to convey the substrate which has been processed by the selected one of the plurality of processors and conveyed to the alignment station by the substrate conveyer to the heating processor.

4. The apparatus according to claim 1, wherein processing the first substrate by the first processor and processing the second substrate by the second processor are performed simultaneously.

5. The apparatus according to claim 1, wherein the apparatus planarizes the composition on the substrate by using, as the mold, a mold whose portion that comes into contact with the composition on the substrate is a flat surface.

6. The apparatus according to claim 1, wherein the apparatus forms a pattern of a composition on the substrate by using, as the mold, a mold on which a pattern having concave and convex portions is formed.

7. The apparatus according to claim 1, wherein the supplier is arranged above the conveying path.

8. A forming method comprising:
 aligning a first substrate in an alignment station;
 conveying, by a conveyer, the first substrate aligned in the alignment station through a conveying path shared by a plurality of processors to a first processor;
 supplying a composition onto the first substrate at a position on a conveying path by a supplier while the first substrate is being conveyed to the first processor through the conveying path by the conveyer;
 forming the composition on the first substrate by causing the first processor to bring a first mold into contact with the composition on the first substrate;

conveying, by the conveyer, the first substrate on which the composition has been formed to the alignment station;

aligning a second substrate in the alignment station;

conveying, by the conveyer, the second substrate aligned in the alignment station to a second processor through the conveying path;

supplying a composition onto the second substrate at the position on the conveying path by the supplier while the second substrate is being conveyed to the second processor by the conveyer, the position being common for the first and second substrates;

forming the composition on the second substrate by causing the second processor to bring a second mold into contact with the composition on the second substrate; and conveying, by the conveyer, the second substrate on which the composition has been formed to the alignment station, wherein the alignment station is shared by the plurality of processors, and wherein the plurality of processors including the first processor and the second processor are disposed separate and apart from the substrate conveyor.

9. An article manufacturing method comprising:

forming a composition on each of a plurality of substrates by using a forming method defined in claim 8; and processing each of a plurality of substrates on which the composition is formed in the forming.

10. The apparatus according to claim 1, wherein the supplier is shared by the plurality of processors, and the supplier is configured to sequentially supply the composition on the plurality of substrates.

11. The apparatus according to claim 1, wherein the alignment station is shared by the plurality of processors, and the alignment station is configured to sequentially align the plurality of substrates.

12. The apparatus according to claim 1, wherein the position on the conveyor path, where the supplier supplies the composition, is surrounded by the plurality of processors and the alignment station.

13. The apparatus according to claim 3, wherein the position on the conveyor path, where the supplier supplies the composition, is surrounded by the plurality of processors, the alignment station and the substrate conveying module.

14. The apparatus according to claim 3, wherein the position on the conveyor path, where the supplier supplies the composition, is located between the substrate conveying module and at least one of the plurality of processors.

15. The apparatus according to claim 3, wherein the heating processor is configured to perform the heating process for a predetermined number of substrates.

* * * * *